(12) United States Patent
Kang et al.

(10) Patent No.: US 11,575,093 B2
(45) Date of Patent: Feb. 7, 2023

(54) PENTACENE ORGANIC FIELD-EFFECT TRANSISTOR WITH N-TYPE SEMICONDUCTOR INTERLAYER AND ITS APPLICATION

(71) Applicant: NANJING UNIVERSITY, Nanjing (CN)

(72) Inventors: Limin Kang, Nanjing (CN); Yiru Wang, Nanjing (CN); Jiang Yin, Nanjing (CN); Yidong Xia, Nanjing (CN); Zhiguo Liu, Nanjing (CN)

(73) Assignee: NANJING UNIVERSITY, Nanjing (CN)

( * ) Notice: Subject to any disclaimer, the term of this patent is extended or adjusted under 35 U.S.C. 154(b) by 158 days.

(21) Appl. No.: 17/103,937

(22) Filed: Nov. 24, 2020

(65) Prior Publication Data

US 2022/0069244 A1 Mar. 3, 2022

Related U.S. Application Data

(63) Continuation of application No. PCT/CN2020/105377, filed on Jul. 29, 2020.

(30) Foreign Application Priority Data

Dec. 23, 2019 (CN) .......................... 201911336850.8
Oct. 26, 2020 (CN) .......................... 202011094113.4

(51) Int. Cl.
*H01L 51/05* (2006.01)
*H01L 51/00* (2006.01)

(52) U.S. Cl.
CPC ...... *H01L 51/0562* (2013.01); *H01L 51/0035* (2013.01); *H01L 51/0072* (2013.01);
(Continued)

(58) Field of Classification Search
CPC ............. H01L 51/0562; H01L 51/0035; H01L 51/0072; H01L 51/0545
See application file for complete search history.

(56) References Cited

FOREIGN PATENT DOCUMENTS

CN 108831996 A * 11/2018 ......... H01L 51/0545

OTHER PUBLICATIONS

Machine Translations of CN 108831996.*
(Continued)

*Primary Examiner* — Anthony Ho
(74) *Attorney, Agent, or Firm* — Treasure IP group, LLC

(57) ABSTRACT

A method for enhancing the performance of pentacene organic field-effect transistor (OFET) using n-type semiconductor interlayer: an n-type semiconductor thin film was set between the insulating layer and the polymer electret in the OFET with the structure of gate-electrode/insulating layer/polymer/pentacene/source (drain) electrode. The thickness of n-type semiconductor layer is 1~200 nm. The induced electrons at the interface of n-type semiconductor and polymer electret lead to the reduction of the height of the hole-barrier formed at the interface of polymer and pentacene, thus effectively reducing the programming/erasing (P/E) gate voltages of pentacene OFET, adjusting the height of hole barrier at the interface of polymer and pentacene to a reasonable scope by controlling the quantity of induced electrons in n-type semiconductor layer, thus improving the performance of pentacene OFET, such as the P/E speeds, P/E endurance and retention characteristics.

11 Claims, 7 Drawing Sheets

(52) U.S. Cl.
CPC ...... *H01L 51/0545* (2013.01); *H01L 51/0533* (2013.01); *H01L 2251/303* (2013.01)

(56) References Cited

OTHER PUBLICATIONS

Abstract of CN 108831996.*
Baeg, K.,-J, Noh, Y. Y., Ghim, J., Kang, S. J., Lee, H. Kim, D. Y., Organic Non-volatile Memory Based on Pentacene Field-Effect Transistors Using a Polymeric Gate Electret., Adv. Mater. 18, 3179-3183(2006).
2. Dimitrakopoulos, C. D. & Malenfant, P. R. Adv. Mater. 14, 99-117(2002).
3. Baeg, K., J., Noh Y. Y., Ghim J., Lim B., Kim D. Y., Polarity Effects of Polymer Gate Electrets on Non-Volatile Organic Field-Effect Transistor Memory, Adv. Funct. Mater. 18, 3678-3685(2008).
4. Leong, W. L., Mathews, N., Mhaisalkar, S., Lam Y. M., Chen, T., Lee, S., Micellar poly(styrene-b-4-vinypyridine)-nanoparticle hybrid system for non-volatile organic transistor memory, J. Mater. Chem. 19, 7354-7361(2009).
5. Knipp, D, Street, R. A., Volkel, A. and Ho, J., Pentacene thin film transistors on inorganic dielectrics: Morphology, structural properties, and electronic transport, J. Appl. Phys. 93, 347-355(2003).
6. Northrup J. E., Chabinyc M. L., Gap states in organic semiconductors: Hydrogen- and Oxygen-induced states in pentacene, Phys. Rev. B 68, 041202(R):1-4(2003).
7. Kalb, W. L., Mattenberger, K. and Batlogg, B., Oxygen-related traps in pentacene thin films: Energetic position and mplications for transistor performance, Phys. Rev. B, 78, 035334:1-11(2008).

* cited by examiner

PENTACENE ORGANIC FIELD-EFFECT TRANSISTOR WITH N-TYPE SEMICONDUCTOR INTERLAYER AND ITS APPLICATION

CROSS REFERENCE TO RELATED APPLICATION

This application claims priority to a PCT application PCT/CN2020/105377 filed on Jul. 29, 2019, which in turn claims priority to a Chinese Application No. 201911336850.8, filed on Dec. 23, 2019. This application also takes priority from a Chinese application 202011094113.4, filed on Oct. 26, 2020. Both the PCT application and two Chinese applications are incorporated herein by reference in their entireties.

FIELD OF THE INVENTION

The invention belongs to the field of organic semiconductor storage technology, particularly to a method and application for enhancing the performance of pentacene organic field-effect transistor by using n-type semiconductor interlayer.

BACKGROUND OF THE INVENTION

Non-volatile electronic devices with the OFET memory units have attracted much attention in past two decades due to its application prospects from radio-frequency identification tags to flexible and large-area active-matrix displays[1, 2]. In order to promote the practical application of the OFETs, great efforts have been made in developing p-channel or n-channel organic semiconductors, including small molecules and polymers, and charge-trapping dielectrics such as polymer electrets. As one of the most promising p-channel organic semiconductors, pentacene, a planar molecule composed of five benzene rings fused along their sides, has been widely investigated for the OFET memory structures. With chargeable polymer electrets, such as polystyrene (PS), PVN and poly(α-methylstyrene) (PαMS), etc., pentacene OFETs shows favorable shifts of threshold voltage in its transfer curves at large enough gate voltages[3]. Baeg et al. programmed pentacene OFET with PαMS charge-storage layer under a gate pulse of 200V/1 μs, and erased the device under a gate pulse of −100V/1 μs$^1$. Leong et al. programmed pentacene OFET with chargeable block copolymer polystyrene-block-poly-4-vinylpyridine (PS-b-P4VP) by applying a gate pulse of −30 V/1 s, and erased it by applying a gate pulse of 100 V/30 s[4]. The present performance of pentacene OFETs such as high operation voltage, low P/E speed, serious endurance and retention degradation and instability in air is still far from reaching the industrial requirements of commercial application in the future. Therefore, up to now, pentacene OFETs using polymer films as charge trapping dielectric has not been used in practical applications.

Many basic researches have been carried out on the background of pentacene OFETs devices using polymer films as charge trapping dielectric. Both theoretical and experimental studies[5, 6] have shown that there are positively charged defects associated with the external environment (e.g., hydrogen and oxygen) at the boundary of pentacene near the interface of pentacene/polymer, and the body density of the positive charge is up to $4\times10^{18}$ cm$^{-3(7)}$. The thickness of the positively-charged defect layer is about 1.5 nm. Due to the defects, the thin layer is no longer of semiconductor characteristics. The electric field formed by the positive charges of thin layer points to p-type semiconductor pentacene thin film, and impedes the transfer of holes from pentacene thin film to polymer thin film. The positively-charged defects act as a positive-charge barrier layer, and the existence of the positive-charge barrier, which results in the high working voltage of pentacene OFETs using polymer films as charge trapping dielectric.

SUMMARY OF THE INVENTION

In a first aspect, one aim of the present invention is to provide a method for enhancing the performance of pentacene OFETs which us polymer thin film as charge trapping dielectric, and to solve the above problems, so as to promote its practical application.

The technical scheme of the present invention is as followed: A method for enhancing the performance of pentacene organic field-effect transistor (OFET) memory. The structure of the OFET is: gate-electrode/insulating layer/polymer/pentacene/source (drain)-electrode; an n-type organic semiconductor buffer layer was set between polymer and pentacene; the resistivity of gate electrode is less than 0.005 Ω·cm; insulating dielectric 2 is an insulator; polymer is a charge-trapping dielectric, and polystyrene, poly(2-vinyl naphthalene) (PVN) and poly(α-methylstyrene) (PαMS) are preferentially selected, but it's not limited to those. The thickness of polymer is 1-100 nm; n-type semiconductor film 4 is a buffer layer, and n-type semiconductor film 4 is an n-type inorganic semiconductor film, or an n-type organic semiconductor film; the thickness of n-type semiconductor film 4 is 1-100 nm; the thickness of pentacene 5 is 1-100 nm; the thickness of source (drain) electrode is 50-200 nm.

The structure of the above described OFET in the present invention is a bottom-gate type, and from the bottom to the top are gate-electrode/insulating layer/polymer/pentacene/source(drain)-electrode. Another structure of the above described OFET in the present invention is a top-gate type, and from the bottom to the top are source(drain)-electrode/pentacene/polymer/insulating layer/gate-electrode, in which an n-type semiconductor buffer layer was also set between pentacene and polymer; two kinds of the OFFET structures are the same essentially, so both of them are included in the present invention.

N-type semiconductor thin film is an n-type organic semiconductor thin film, which includes n-type organic small molecules thin film and n-type polymer thin film, such as N,N'-Ditridecylperylene-3,4,9,10-tetracarboxylic diimide (PTCDI-C13), N,N'-Bis(3-pentyl) perylene-3,4,9,10-bis (dicarboximide) (EP-PDI) and 1,3,6,8(2H,7H)-Tetraone, 2,7-dicyclohexylbenzo[lmn][3,8]phenanthroline (NDI); It's a crystalline thin film, or a semi-crystalline thin film, or a noncrystalline thin film.

The preparation methods of n-type semiconductor thin film include the solution method, spin-coating method, sol-gel method, spray method, silk-screen printing method, ink-jet printing method, thermal evaporation method, and other similar physical and chemical methods; the thickness of n-type semiconductor thin film is 1-100 nm.

N-type semiconductor thin film also can be an n-type inorganic semiconductor thin film including ZnSe, ZnS, ZnO; The preparation methods of n-type semiconductor thin film include rf-magnetron sputtering, thermal evaporation and electron beam evaporation; Its thickness is 1-100 nm; It's a crystalline thin film, or a noncrystalline thin film.

The n-type semiconductor thin film can be a hybridized structure with two kind of n-type semiconductor thin films.

It can be an n-type inorganic semiconductor film prepared on the surface of n-type organic small molecule semiconductor film, or an n-type polymer semiconductor film prepared on the surface of n-type organic small molecule semiconductor film. The aim of this invention is to improve the morphology of n-type semiconductor buffer layer and make it more flat in order to improve the morphology of pentacene semiconductor thin film grown on it later. Specifically, the aim of this invention is to improve the density, flatness and grain size of pentacene thin films, so as to improve the field-effect mobility of hole carriers in pentacene thin films; The thickness of n-type small molecule semiconductor film in the hybridized film structure is 1-10 nm.

The preparation methods of pentacene thin film include, spin-coating method, sol-gel method, spray method, silk-screen printing method, ink-jet printing method, thermal evaporation method, and other similar physical and chemical film preparation methods; its thickness is 1-50 nm.

The polymer dielectric thin film can be polystyrene (PS), or poly(2-vinyl naphthalene) (PVN), etc., but it's not limited to those. It has a charge-trapping ability, and its thickness is 1-100 nm.

The insulating thin film is an insulator such as $SiO_2$, $Al_2O_3$, which can block the charges trapped by the polymer flowing to the gate electrode.

The gate electrode can be a metal, conductive nitride or conductive oxide material. The gate electrode of the bottom-gate OFETs also can be a heavily doped n-type silicon with a high conductivity or heavily doped p-type silicon with a high conductivity. The gate electrode of the bottom-gate type OFETs also can be a flexible substrate with a conductive coating.

The source (drain) electrode can be a metal, conductive nitride or conductive oxide material.

The structure of pentacene OFET memory device obtained according to the above-described method is the bottom-gate type: from the bottom to the top are gate-electrode/insulating layer/polymer/n-type semiconductor buffer layer/pentacene/source (drain)-electrode. The structure of pentacene OFETs also can be the top-gate type: from the bottom to the top are source(drain)-electrode/pentacene/n-type semiconductor buffer layer/polymer/insulating layer/gate-electrode.

There are positively charged defects associated with the external environment (e.g., hydrogen and oxygen) at the boundary of pentacene near the interface of pentacene/polymer, and the body density of the positive charges is up to $4 \times 10^{18}$ $cm^{-3(7)}$. The thickness of the positively charged defect layer is about 1.5 nm, and the defect layer is no longer of semiconductor characteristics. The electric field formed by positive charges in the defect layer points to pentacene thin film, and impedes the transfer of holes from pentacene thin film to polymer thin film. The positively charged defects acts as a hole-barrier layer, and the existence of the hole-barrier results in the high working-voltage of pentacene OFETs using polymer films as charge trapping dielectric as reported in references.

After introducing n-type semiconductor buffer layer, the electrons are aggregated at the surface of n-type organic layer near the interface of n-type semiconductor and pentacene due to the electrostatic induction, which was resulted in by the positive charges in the defect layer in pentacene. Thus, the electrons with a high density reduce the density of local positive charges at the interface due to the part compensation of positive charges by the accumulated electrons, leading to a reduction of the height of hole-barrier formed at the interface. The reduction of the height of hole-barrier can effectively reduce the P/E gate voltages of pentacene OFETs. The widened distribution region of positive space charges caused by the ionized donors (positive charges) in n-type organic layer, which density decreases from the interface to the interior, increases the physical width of the hole-barrier, and restricts the back-transfer of holes trapped in polymer to pentacene thin film. It favors the improvements of the P/E endurance and the retention characteristics of pentacene OFETs.

The beneficial effect of the present invention is: an n-type semiconductor thin film was set as a buffer layer between pentacene and polymer electret in the OFET with the structure of gate-electrode/insulating layer/polymer/pentacene/source(drain)-electrode. The induced electrons near the interface lead to the reduction of the height of hole-barrier formed at the interface of polymer/pentacene, and effectively reduces the P/E gate voltages of pentacene OFET. The widened distribution region of positive space charges caused by the ionized donors in organic buffer layer effectively restricts the back-transfer of holes from polymer thin film to pentacene thin film, thus improve the performance of the P/E endurance and the retention characteristics of pentacene OFET.

In a second aspect, another aim of the present invention is to provide a method for enhancing the performance of pentacene organic field-effect transistor (OFET) using n-type semiconductor interlayer between pentacene and polymer charge-trapping dielectric, and to solve the above problems, thus promoting its practical application. In Chinese patent with application number CN201911336850.8, a method was proposed by introducing an n-type semiconductor layer at the interface of pentacene/polymer to improve the performance of pentacene field-effect transistor devices. In this patent, a method is proposed by introducing an interlayer between polymer charge-trapping dielectric and the insulating layer to improve the performance of pentacene field effect transistor devices.

The technical scheme of the present invention is as followed: A method for enhancing the performance of pentacene organic field-effect transistor (OFET) by introducing an n-type semiconductor interlayer between the polymer charge-trapping dielectric and the insulating layer. The structure of traditional pentacene OFET is: gate-electrode/insulating layer/polymer/pentacene/source (drain)-electrode. An n-type semiconductor thin film was set between the insulating layer and the polymer electret; The gate electrode 1 is a conductor which a resistivity of less than 0.005 Ω·cm, and the insulating layer 2 is an insulator; N-type semiconductor thin film 3 is an n-type inorganic semiconductor thin film or an n-type organic semiconductor thin film; The polymer 4 is a charge-trapping dielectric, and the thickness of polymer layer is 1-100 nm; The thickness of pentacene 5 is 1-100 nm; The thickness of source(drain)-electrode 6 is 50-200 nm.

The structure of the above described OFET in the present invention is a bottom-gate type, and from the bottom to the top are gate-electrode/insulating layer/n-type semiconductor layer/polymer/pentacene/source(drain)-electrode. Another structure of the above described OFET in the present invention is a top-gate type, and from the bottom to the top are source(drain)-electrode/pentacene/polymer/n-type semiconductor layer/insulating layer/gate-electrode, in which an n-type semiconductor layer was also set between the insulating layer and the polymer; two kinds of OFFET structures are the same essentially, so both of them are included in the present invention.

N-type semiconductor thin film is an n-type inorganic semiconductor thin film including ZnSe, ZnS, ZnO, amorphous indium-gallium-zinc oxide (IGZO), an oxygen-deficient oxide film and an oxygen-deficient composite oxide film, such as $TiO_{2-x}$ and $ZrHfO_{2-x}$; The preparation methods of n-type inorganic semiconductor thin film include rf-magnetron sputtering, thermal evaporation and electron-beam evaporation; Its thickness is 1-200 nm; It's a crystalline thin film or a non-crystalline thin film.

N-type semiconductor thin film is an n-type organic semiconductor thin film, which includes n-type organic small-molecule semiconductor and n-type polymer semiconductor, such as N,N'-Ditridecylperylene-3,4,9,10-tetracarboxylic diimide (PTCDI-C13), N,N'-Bis(3-pentyl) perylene-3,4,9,10-bis (dicarboximide) (EP-PDI) and 1,3,6,8(2H,7H)-Tetraone, 2,7-dicyclohexylbenzo[lmn][3,8] phenanthroline (NDI), but not limited to the above organic films; It's a crystalline thin film, or a semi-crystalline thin film, or an amorphous thin film. The preparation methods of n-type organic semiconductor thin film include the solution method, spin-coating method, sol-gel method, spray method, silk-screen printing method, ink-jet printing method, thermal evaporation method, and other similar physical and chemical methods; the thickness of n-type semiconductor thin film is 1-100 nm.

N-type semiconductor thin film can be a hybridized structure with two kind of n-type semiconductor thin films. It can be an n-type inorganic semiconductor film prepared on the surface of n-type organic small molecule semiconductor film, or an n-type polymer semiconductor film prepared on the surface of n-type organic small molecule semiconductor film. The thickness of n-type organic semiconductor film in the hybridized structure is 0.5-60 nm, and the thickness of n-type inorganic semiconductor film is 0.5-60 nm, but the thickness of the hybridized film is 1-100 nm.

The preparation methods of pentacene thin film include spin-coating method, sol-gel method, spray method, silk-screen printing method, ink-jet printing method, thermal evaporation method, and other similar physical and chemical film preparation methods; its thickness is 1-50 nm.

The polymer dielectric thin film can be polystyrene (PS), or poly(2-vinyl naphthalene) (PVN), or other organic film with a charge-trapping ability, but it's not limited to those, and its thickness is 1-100 nm.

The insulating thin film is an insulator such as $SiO_2$, $Al_2O_3$, or insulating polymer, which can block the charges trapped by the charge-trapping polymer dielectric flowing to the gate electrode.

The gate electrode can be a metal, conductive nitride or conductive oxide material. The gate electrode of the bottom-gate OFETs also can be a heavily doped n-type silicon with a high conductivity or heavily doped p-type silicon with a high conductivity. The gate electrode of the bottom-gate OFETs also can be a flexible substrate with a conductive coating.

The source (drain) electrode can be a metal, conductive nitride or conductive oxide material.

The structure of pentacene OFET memory device obtained according to the above-described method is the bottom-gate type: from the bottom to the top are gate-electrode/insulating layer/n-type semiconductor layer/polymer/pentacene/source (drain)-electrode. The structure of pentacene OFETs also can be the top-gate type: from the bottom to the top are source(drain)-electrode/pentacene/polymer/n-type semiconductor layer/insulating layer/gate-electrode.

There are positively charged defects associated with the external environment (e.g., hydrogen and oxygen) at the crystal boundaries of pentacene film near the interface of pentacene/polymer, and the body density of the positive charges is up to $4\times10^{18}$ $cm^{-3}$. The thickness of the positively charged defect layer is about 1.5 nm, and the defect layer is no longer of semiconductor characteristics. The electric field formed by the positive charges in the defect layer points to pentacene thin film, and impedes the transfer of holes from pentacene thin film to polymer thin film. The positively charged defects act as a hole-barrier layer, and the existence of the hole-barrier results in the high working-voltage of pentacene OFETs using polymer films as charge trapping dielectric as reported in references.

After introducing an n-type semiconductor interlayer, the electrons with a high density are accumulated at the surface of n-type semiconductor layer near the interface with polymer. The electrons are induced due to the electrostatic induction of the positively charged interface of pentacene and polymer, and the ionized donors (positive charges), which density decreases from the interface to the interior of n-type organic layer, distribute in n-type semiconductor layer. Due to the accumulation of electrons with a high density at the interface of polymer/n-type semiconductor, the electric-field strength of positive charges at the interface of pentacene and polymer is greatly reduced, thus the height of hole-barrier at the interface of pentacene and polymer is greatly reduced. The significant decrease in the height of the hole-barrier at the interface between pentacene and polymer makes the working voltage for driving hole-carriers from pentacene to polymer or driving hole-carriers from polymer back to pentacene effectively decreased, that is, the programming/erasing voltages of organic semiconductor field-effect transistor are effectively reduced. By controlling the quantity of n-type carriers in n-type semiconductor layer to adjust the height of hole-barrier at the interface of polymer and pentacene to a reasonable level, the performance of pentacene OFET, such as the P/E speeds, P/E endurance and retention characteristics, can be effectively enhanced.

The original structure of pentacene OFET device is: gate-electrode/insulating layer/polymer/pentacene/source (drain)-electrode; In Chinese patent of CN201911336850.8, the n-type semiconductor layer was set between polymer and pentacene; In present invention the n-type semiconductor layer is set between the insulating layer and the polymer film. The position of the interlayer in the present patent is different with that in Chinese patent of CN201911336850.8. The OFETs in the present patent have better performance.

DETAILED EMBODIMENTS

Embodiment 1

The structure of the traditional pentacene organic field-effect transistor (OFET) is gate-electrode/insulating layer/polymer/pentacene/source(drain)-electrode. In the present invention an n-type semiconductor thin film was set as a buffer layer between pentacene and polymer electret.

The polymer thin film can be polystyrene (PS), or poly (2-vinyl naphthalene) (PVN), etc., but it's not limited to those. Which has a charge-trapping ability. The preparation methods of the polymer thin film include spin-coating method, sol-gel method, spray method, silk-screen printing method, ink-jet printing method, and other similar physical and chemical film preparation methods; the thickness of polymer film is 1-100 nm.

The n-type semiconductor buffer layer can be an n-type inorganic semiconductor thin film, or an n-type organic semiconductor thin film.

The preparation methods of n-type inorganic semiconductor thin film include thermal evaporation and electron beam evaporation; The thickness of n-type inorganic semiconductor thin film is 1-50 nm. The preparation methods of n-type organic semiconductor thin film include the solution method, spin-coating method, sol-gel method, spray method, silk-screen printing method, ink-jet printing method, thermal evaporation method, and other similar physical and chemical methods; Its thickness is 1-100 nm.

N-type semiconductor thin film also can be a hybridized structure with two kinds of n-type semiconductor thin films. It can be an n-type inorganic semiconductor film prepared on the surface of n-type organic small molecule semiconductor film, or an n-type polymer semiconductor film prepared on the surface of n-type organic small molecule semiconductor film. The aim is to improve the morphology of n-type semiconductor buffer layer and make it flatter to improve the morphology of pentacene semiconductor thin film grown on it later. Specifically, the aim is to improve the density, flatness and grain size of pentacene thin films, and to improve the field-effect mobility of hole carriers in pentacene semiconductor thin films; The thickness of n-type small molecule semiconductor film in the hybridized structure thin film is 1-10 nm.

The source (drain) electrode can be a metal, conductive nitride or conductive oxide material. The preparation methods of the source (drain) electrode include the physical deposition methods such as rf-magnetron sputtering and electron beam evaporation, and the chemical deposition methods such as atomic layer deposition method (ALD). The gate electrode of the bottom-gate type OFETs also can be a heavily doped n-type silicon with a high conductivity or a heavily doped p-type silicon with a high conductivity. The gate electrode of the bottom-gate type OFETs also can be a flexible substrate with a conductive coating.

Figure 1:
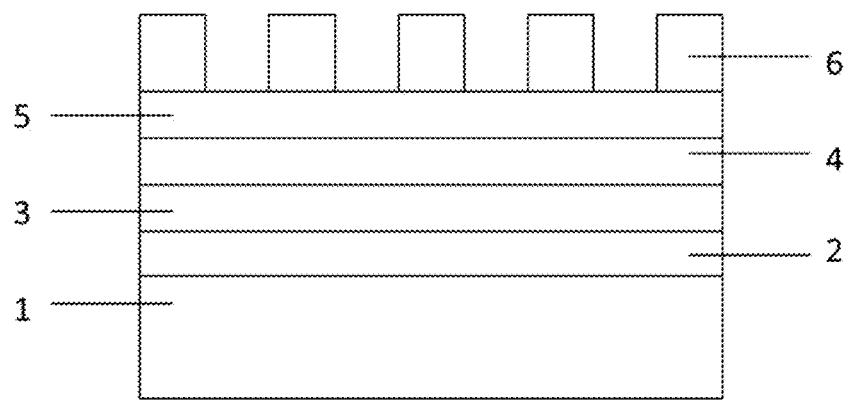
FIG. 1 shows the schematic drawing of the structure of the organic field-effect transistor (OFET) based on the method for enhancing the performance of pentacene OFET. No. 1 layer is gate electrode, No. 2 layer is insulating layer, No. 3 layer is polymer dielectric thin film, No. 4 layer is n-type semiconductor thin film buffer layer, No. 5 layer is pentacene, and No. 6 layer is source (drain) electrode.

FIG. 1 shows the schematic drawing of the structure of the organic field-effect transistor (OFET) in embodiment 1. In FIG. 1, No. 1 layer is gate electrode using the heavy doped p-Si gate electrode with a crystal direction of <100>, which resistivity is less than 0.005 Ω·cm; No. 2 layer is $SiO_2$, which thickness is 90 nm; No. 3 layer is poly(2-vinyl naphthalene) (PVN), which thickness is 40 nm; No. 4 layer is N,N'-Ditridecylperylene-3,4,9,10-tetracarboxylic diimide (PTCDI-C13), which thickness is 20 nm; No. 5 layer is pentacene, which thickness is 40 nm; No. 6 layer is copper source (drain) electrode, which thickness is 100 nm.

The specific preparation process steps are as followed:

P—Si substrate covered with a 90-nm thermally-oxidized $SiO_2$ layer was cleaned with acetone, ethanol and the de-ionized water for 10 minutes successively, and then dried with nitrogen gun for later use.

A 40-nm PVN charge-trapping layer was grown on p-Si substrate by using spin-coating method.

Then, PTCDI-C13 (20 nm) layer and pentacene (40 nm) layer were grown on the PVN-covered $SiO_2$/Si(100) substrates by using the vacuum thermal evaporation method, respectively.

The square copper (Cu) electrode with a side-length of 300 μm and a thickness of 100 nm was grown on the above-described sample by using the vacuum thermal evaporation method.

The bottom heavily-doped p-Si was employed as the gate electrode.

The electrical characteristics of the OFETs were measured with a semiconductor parameter analyzer (Keithley 4200). The output characteristic, transfer characteristic, programming/erasing (P/E) speeds, endurance characteristics and retention characteristics of the devices were analyzed by testing the relationship between the tested current and the applied voltage.

The working principles of pentacene OFET memory device are as the following description. When a certain voltage is applied between two adjacent Cu electrodes of the memory device without applied gate voltage, namely the source electrode and the drain electrode, the current between the source electrode and the drain electrode is usually very small, and the current characteristic is similar to that of the insulator, and the device is in the OFF state. When a high enough negative voltage is applied to the gate electrode, a conducting channel will be generated in pentacene near the interface with the insulating layer, and then the current between the source electrode and the drain electrode will increase rapidly, making the device conducting. Thus, the device is in the ON state.

Figure 2:
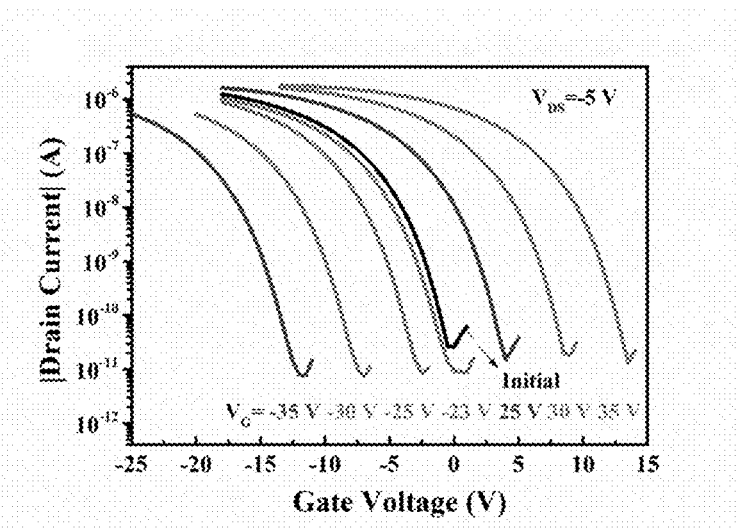
FIG. 2 shows the transfer characteristics of pentacene OFETs with PTCDI-C13 buffer layer: the charge-trapping dielectric is poly (2-vinyl naphthalene) (PVN), the organic semiconductor is pentacene.

FIG. 2 shows the transfer characteristics of pentacene OFETs with PTCDI-C13 buffer layer in embodiment 1, the voltage between the drain electrode and the source electrode is −5 V, the range of the sweeping voltage applied on the gate electrode is ±23 V~±35 V. It can be seen that starting from the voltage of ±23 V, the memory window grows rapidly with the increase of the voltage. Here, the terminology 'memory window' ($\Delta V_{TH}$) is an important parameter for the OFET memory devices, which is defined as the difference between threshold voltages ($V_{TH}$) in the programmed and the erased states. When the sweeping voltage is ±35 V, the memory window exceeds 25 V, and the difference between the OFF and the ON states is obvious.

Figure 3:
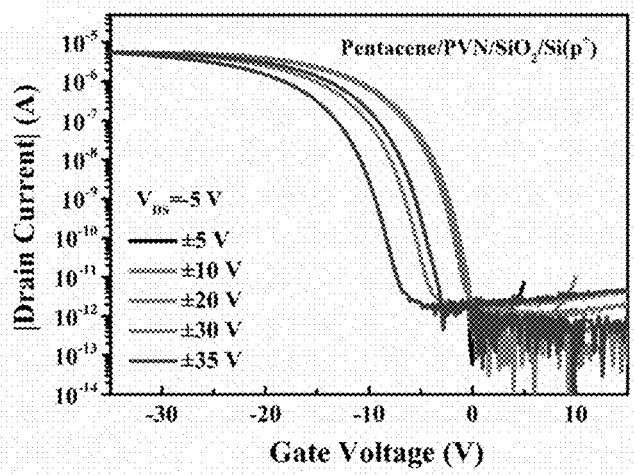
FIG. 3 shows the transfer characteristics of pentacene OFETs without PTCDI-C13 buffer layer: the charge-trapping dielectric is poly (2-vinyl naphthalene) (PVN), the organic semiconductor is pentacene.

FIG. 3 shows the transfer characteristics of pentacene OFETs without PTCDI-C13 buffer layer in embodiment 1, the voltage between the drain electrode and the source electrode is −5 V, and the range of the sweeping voltage applied on the gate electrode is ±5 V~±35 V. It can be seen that when the voltage is lower than 25 V, the curve shows almost no shift. Then, the memory window grows slowly with the increase of the gate voltage. When the sweeping voltage is ±35 V, the memory window is still less than 5V, and the difference between the OFF and the ON states is not obvious.

According to the comparison as shown in FIG. 2 and FIG. 3, after introducing PTCDI-C13 buffer layer, the memory window of the device becomes significantly larger and the transfer characteristics are significantly improved.

Figure 4:
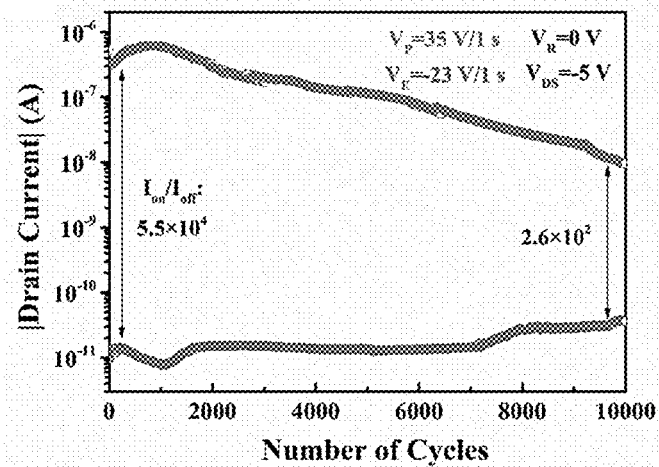
FIG. 4 shows the endurance characteristics of pentacene OFETs with PTCDI-C13 buffer layer: the charge-trapping dielectric is poly (2-vinyl naphthalene) (PVN), the organic semiconductor is pentacene.

FIG. 4 shows the endurance characteristics of pentacene OFETs with PTCDI-C13 buffer layer in embodiment 1. The programming gate pulse is 35V/1 s, the erasing gate pulse: −23V/1 s, the applied voltage between the source electrode and the drain electrode is −5 V, and the reading voltage is 0 V. It can be seen that the initial switching current ratio of the device ($I_{ON}/I_{OFF}$) is $5.5 \times 10^4$, and the switching current ratio of the device is still up to $2.6 \times 10^2$ after 10,000 P/E switching cycles, indicating that the memory device has good endurance characteristics.

Figure 5:
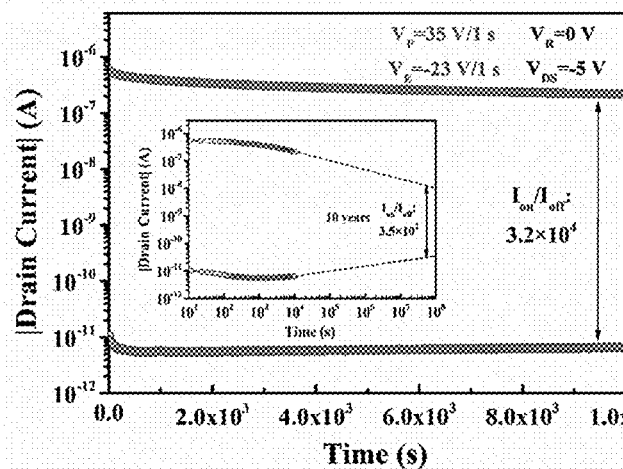
FIG. 5 shows the retention characteristics of pentacene OFETs with PTCDI-C13 buffer layer: the charge-trapping dielectric is poly (2-vinyl naphthalene) (PVN), the organic semiconductor is pentacene.

FIG. 5 shows the retention characteristics of pentacene OFETs with PTCDI-C13 buffer layer in embodiment 1. The programming pulse is 35V/1 s, and the erasing pulse is −23V/1 s. The applied voltage between the source electrode and the drain electrode is −5V, and the reading voltage is 0 V. The switching current ratio of the device ($I_{ON}/I_{OFF}$) is still up to $3.2 \times 10^4$ after $1 \times 10^4$ s. By extending the curve to 10-year scale, the calculated current switch ratio would be $3.5 \times 10^2$, indicating that the device has good retention characteristics.

Embodiment 2

The difference between embodiment 1 and embodiment 2 is that the charge-trapping layer 3 is polystyrene (PS), which thickness is 40 nm, and the preparation method is still spin coating method.

Figure 6:
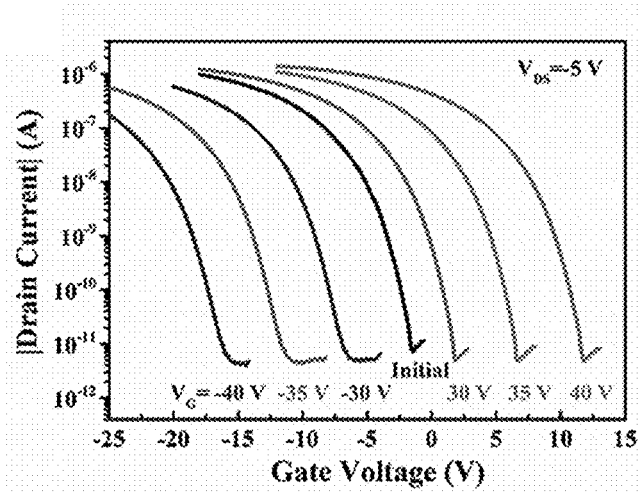
FIG. 6 shows the transfer characteristics of pentacene OFETs with PTCDI-C13 buffer layer: the charge-trapping dielectric is polystyrene (PS), the organic semiconductor is pentacene.

FIG. 6 shows the transfer characteristics of pentacene OFETs with PTCDI-C13 buffer layer in embodiment 2. The applied voltage between the drain electrode and the source electrode is −5 V, and the range of the sweeping voltage applied on the gate electrode is ±30 V~±40 V. It can be seen that the memory window grows rapidly with the increase of the applied voltage. When the sweeping voltage is ±35 V, the memory window exceeds 17 V, and the difference between the ON and OFF states is obvious.

Figure 7:
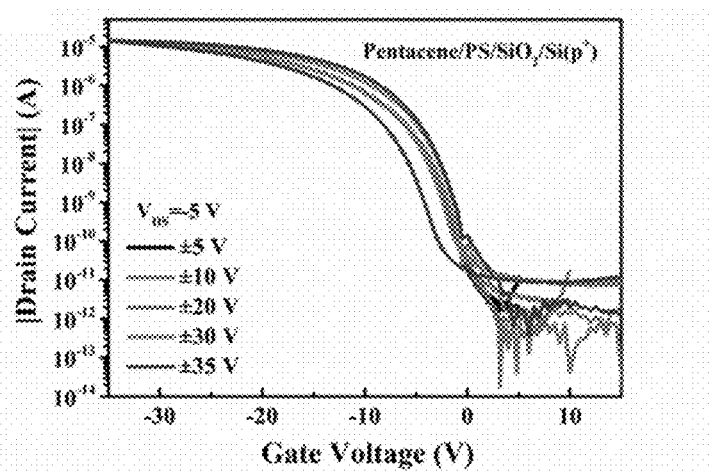
FIG. 7 shows the transfer characteristics of pentacene OFETs without PTCDI-C13 buffer layer, the charge-trapping dielectric is polystyrene (PS), the organic semiconductor is pentacene.

FIG. 7 shows the transfer characteristics of pentacene OFETs without PTCDI-C13 buffer layer, the voltage between the drain electrode and the source electrode is −5V, and the range of the sweeping voltage applied on the gate electrode is ±5 V~±35 V. It can be seen that when the voltage is lower than 25V, the curve barely moved. Then, the memory window grows slowly with the increase of the voltage. When the sweeping voltage is ±35V, the memory window still smaller than 5V, and the difference between the ON and the OFF states is not obvious.

According to the comparison in FIG. 6 and FIG. 7, after introducing the PTCDI-C13 buffer layer, the memory window of the device becomes significantly larger and the transfer characteristics are significantly improved.

Embodiment 3

The difference between embodiment 1 and embodiment 3 is that n-type semiconductor thin film 4 is zinc oxide (ZnO), which thickness is 10 nm, and the preparation method of it is rf-magnetron sputtering.

Figure 8:
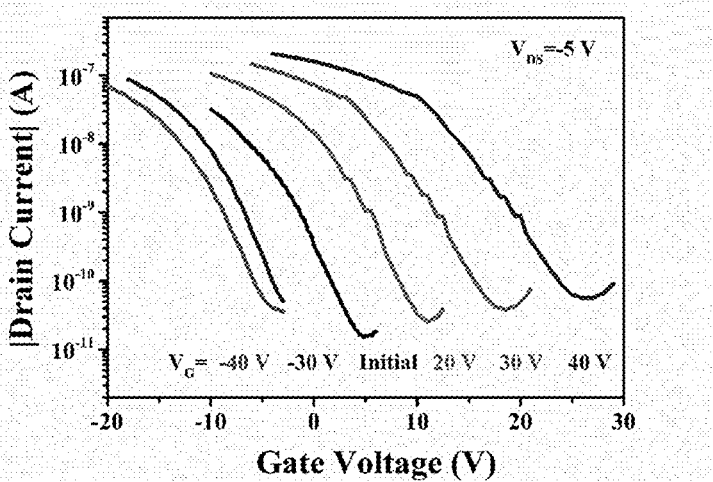
FIG. 8 shows the transfer characteristics of pentacene OFETs with ZnO buffer layer: the charge-trapping dielectric is poly (2-vinyl naphthalene) (PVN), the organic semiconductor is pentacene.

FIG. 8 shows the transfer characteristics of pentacene OFETs with ZnO buffer layer. The applied voltage between the drain electrode and the source electrode is −5 V, and the range of the sweeping voltage applied on the gate electrode is ±5V∼±40 V. It can be seen that the memory window grows rapidly with the increase of the voltage. When the sweeping voltage is ±30V, the window is about 20V and the difference between the ON and the OFF states is obvious.

According to the comparison in FIG. 8 and FIG. 3, after introducing ZnO buffer layer, the memory window of the device becomes significantly larger and the transfer characteristics are significantly improved.

Embodiment 4

The structure of traditional pentacene organic field-effect transistor (OFET) is gate-electrode/insulating layer/polymer/pentacene/source(drain)-electrode. In the present invention an n-type semiconductor thin film was set between the insulating layer and the polymer electret.

The n-type semiconductor layer can be an n-type inorganic semiconductor thin film, or an n-type organic semiconductor thin film.

The preparation methods of n-type inorganic semiconductor thin film include rf-magnetron sputtering, thermal evaporation and electron beam evaporation; The thickness of n-type inorganic semiconductor thin film is 1-200 nm. The preparation methods of n-type organic semiconductor thin film include the solution method, spin-coating method, sol-gel method, spray method, silk-screen printing method, ink-jet printing method, thermal evaporation method, and other similar physical and chemical methods; Its thickness is 1-100 nm.

N-type semiconductor thin film also can be a hybridized structure with two kinds of n-type semiconductor thin films. It can be an n-type inorganic semiconductor film prepared on the surface of n-type organic small molecule semiconductor film, or an n-type polymer semiconductor film prepared on the surface of n-type organic small molecule semiconductor film. The thickness of n-type organic semiconductor film in the hybridized structure is 0.5-60 nm, the thickness of n-type inorganic semiconductor film is 0.5-60 nm, but the thickness of hybridized film is 1-100 nm.

The polymer thin film can be polystyrene (PS), or poly (2-vinyl naphthalene) (PVN), etc., which has a charge-trapping ability, but it's not limited to those. The preparation methods of the polymer thin film include spin-coating method, sol-gel method, spray method, silk-screen printing method, ink-jet printing method, and other similar physical and chemical film preparation methods; the thickness of polymer film is 1-100 nm.

The gate electrode and the source (drain) electrode can be a metal, conductive nitride or conductive oxide material. The preparation methods of the source (drain) electrode include the physical deposition methods such as rf-magnetron sputtering and electron beam evaporation, and the chemical deposition methods such as atomic layer deposition method (ALD). The gate electrode of the bottom-gate OFETs also can be a heavily doped n-type silicon with a high conductivity or a heavily doped p-type silicon with a high conductivity. The gate electrode of the bottom-gate OFETs also can be a flexible substrate with a conductive coating.

Figure 9:
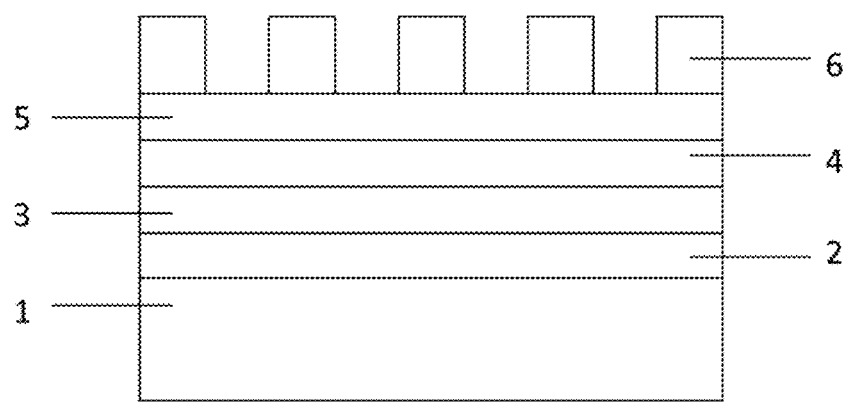
FIG. 9 shows the schematic drawing of the structure of the organic field-effect transistor (OFET) based on the method for enhancing the performance of pentacene OFET. No. 1 layer is gate electrode, No. 2 layer is insulating layer, No. 3 layer is n-type semiconductor interlayer, No. 4 layer is polymer dielectric thin film, No. 5 layer is pentacene, and No. 6 layer is source (drain) electrode.

FIG. 9 shows the schematic drawing of the structure of the pentacene organic field-effect transistor (OFET) in embodiment 1. In FIG. 1, No. 1 layer is gate electrode using the heavy doped p-Si gate electrode with a crystal direction of <100>, which resistivity is less than 0.005 Ω·cm; No. 2 layer is $SiO_2$, which thickness is 90 nm; No. 3 layer is ZnO, which thickness is 20 nm; No. 4 layer is poly(2-vinyl naphthalene) (PVN), which thickness is 40 nm; No. 5 layer is pentacene, which thickness is 40 nm; No. 6 layer is copper source (drain) electrode, which thickness is 100 nm.

The specific preparation process steps are as followed:

P—Si substrate covered with a 90-nm thermally-oxidized $SiO_2$ layer was cleaned with acetone, ethanol and the de-ionized water for 10 minutes successively, and then dried with nitrogen gun for later use.

A 10-nm ZnO was grown on p-Si substrate by using magnetron sputtering method. Because O atoms are easy to be lost in the preparation process, ZnO thin film grown by magnetron sputtering method is actually an n-type semiconductor. The lack of O components leads to the n-type semiconductor characteristics of ZnO thin film.

A 40-nm PVN charge-trapping layer was grown on the ZnO-covered $SiO_2$/Si(100) substrates by using spin-coating method.

Then, pentacene (40 nm) layer were grown on the PVN/ZnO/$SiO_2$/Si(100) substrates by using the thermal evaporation method.

The square copper (Cu) electrode with a scale of 300 μm and a thickness of 100 nm was grown on the above-described sample by using the thermal evaporation method.

The bottom heavily-doped p-Si was employed as the gate electrode.

The electrical characteristics of the OFETs were measured with a semiconductor parameter analyzer (Keithley 4200). The output characteristic, transfer characteristic, programming/erasing (P/E) speeds, endurance characteristics and retention characteristics of the devices were analyzed by testing the relationship between the drain-source current and the applied gate voltage.

The working principles of pentacene OFET are as the following descriptions. When a certain voltage is applied between two adjacent Cu electrodes without applied gate voltage, namely the source electrode and the drain electrode, the current between the source electrode and the drain electrode is usually very low, and the current characteristic is similar to that of the insulator, and the OFET is in the 'OFF' state. When a high enough negative voltage is applied to the gate electrode, a conducting channel will be generated in pentacene layer near the interface with the insulating layer, and then the current between the source electrode and the drain electrode will increase rapidly, making the device conducting. Thus, the device is in the 'ON' state.

Figure 10:
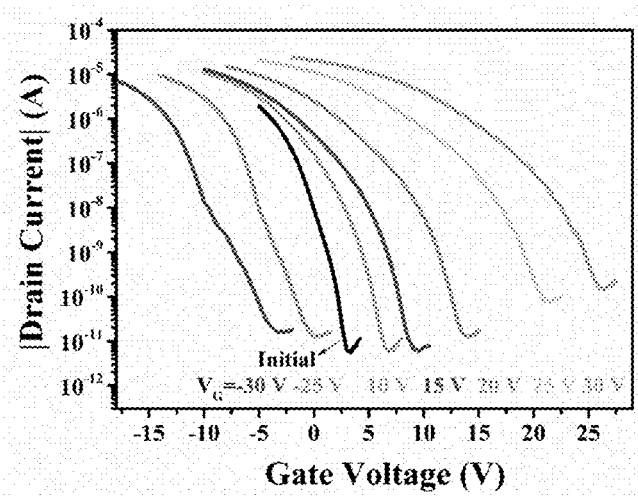
FIG. 10 shows the transfer characteristics of pentacene OFETs with ZnO interlayer: the charge-trapping dielectric is poly (2-vinyl naphthalene) (PVN), the organic semiconductor is pentacene.

FIG. 10 shows the transfer characteristics of pentacene OFETs with ZnO interlayer in embodiment 1, the voltage between the drain electrode and the source electrode is −5 V, the range of the sweeping voltage applied on the gate electrode is ±10 V∼±30 V. It can be seen that the memory window grows rapidly with the increase of the voltage. Here, the terminology 'memory window' ($\Delta V_{TH}$) is an important parameter for the OFET, which is defined as the shift between the threshold voltages ($V_{TH}$) in the transfer characteristic curves in the programmed and the erased states. When the sweeping voltages are ±30 V, the memory window exceeds 30 V, and the difference between the 'OFF' and the 'ON' states is obvious.

FIG. 3 shows the transfer characteristics of pentacene OFETs without ZnO interlayer in embodiment 1, the voltage between the drain electrode and the source electrode is −5 V, and the range of the sweeping voltage applied on the gate electrode is ±15 V∼±40 V. It can be seen that when the voltages are not over than ±25 V, the curve shows almost no shift. Then, the memory window grows slowly with the increase of the applied gate voltage. When the sweeping voltages are ±35 V, the memory window is still less than 10V, and the difference between the 'OFF' and the 'ON' states is not obvious.

Figure 11:
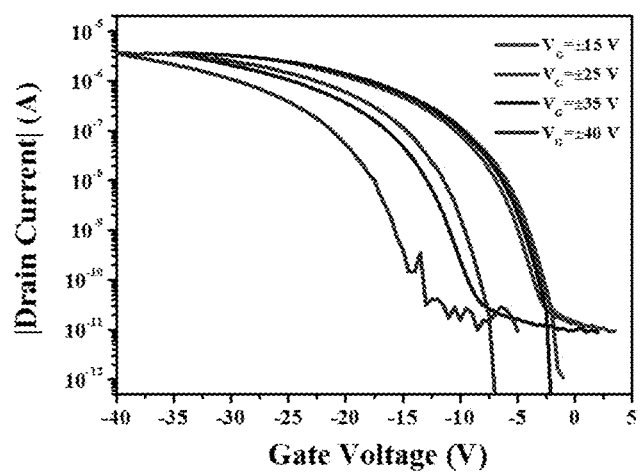
FIG. 11 shows the transfer characteristics of pentacene OFETs without ZnO interlayer: the charge-trapping dielectric is poly (2-vinyl naphthalene) (PVN), the organic semiconductor is pentacene.

According to the comparison as shown in FIG. 10 and FIG. 11, after introducing ZnO interlayer, the memory window of the device becomes significantly larger and the transfer characteristics are significantly improved.

Figure 12:
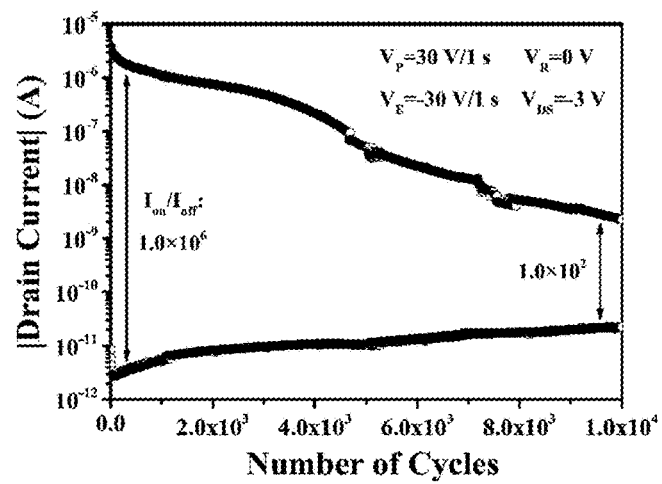
FIG. 12 shows the endurance characteristics of pentacene OFETs with ZnO interlayer: the charge-trapping dielectric is poly (2-vinyl naphthalene) (PVN), the organic semiconductor is pentacene.

FIG. 12 shows the endurance characteristics of pentacene OFETs with ZnO interlayer in embodiment 1. The programming gate pulse is 30V/1 s, the erasing gate pulse: −30V/1 s, the applied voltage between the source electrode and the drain electrode is −5 V, and the reading voltage is 0 V. It can be seen that the initial current ratio of the device ($I_{ON}/I_{OFF}$) is $1.0 \times 10^6$, and the current ratio of $I_{ON}/I_{OFF}$ for the device is still up to $1.0 \times 10^2$ after 10,000 P/E switching cycles, indicating that the memory device has good endurance characteristics.

Figure 13:
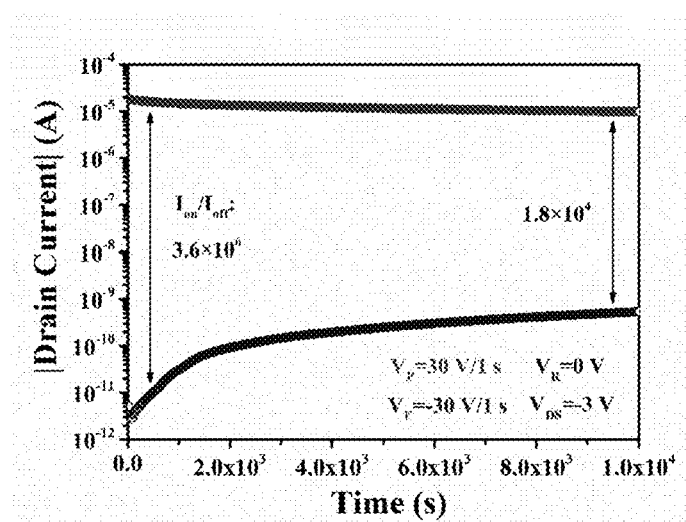
FIG. 13 shows the retention characteristics of pentacene OFETs with ZnO interlayer: the charge-trapping dielectric is poly (2-vinyl naphthalene) (PVN), the organic semiconductor is pentacene.

FIG. 13 shows the retention characteristics of pentacene OFETs with ZnO interlayer in embodiment 1. The programming pulse is 30V/1 s, and the erasing pulse is −30V/1 s. The applied voltage between the source electrode and the drain electrode is −5V, and the reading voltage is 0 V. The current ratio of $I_{ON}/I_{OFF}$ for the device is still up to $1.8 \times 10^4$ after $1 \times 10^4$ s, indicating that the device has good retention characteristics.

Embodiment 5

The difference between embodiment 2 and embodiment 1 is that the n-type semiconductor layer 3 is IGZO, which thickness is 10 nm, and the preparation method is still magnetron sputtering method, and the growth parameter of IGZO during the sputtering process was $Ar:O_2$=15:1, and the growth time was 1 min.

Figure 14:
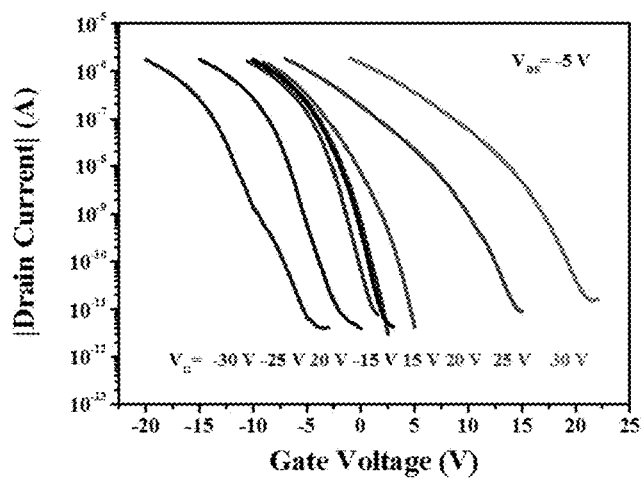
FIG. 14 shows the transfer characteristics of pentacene OFETs with IGZO interlayer: The growth parameter of IGZO during the sputtering process was $Ar:O_2=15:1$, and the growth time was 1 min, and the thickness was 10 nm, the charge-trapping dielectric is poly (2-vinyl naphthalene) (PVN), the organic semiconductor is pentacene.

FIG. 14 shows the transfer characteristics of pentacene OFETs with IGZO interlayer in embodiment 2. The applied voltage between the drain electrode and the source electrode is −5 V, and the range of the sweeping voltage applied on the gate electrode is ±15 V~±35 V. It can be seen that the memory window grows rapidly with the increase of the voltage. When the sweeping voltages are ±35 V, the memory window exceeds 30 V, and the difference between the 'OFF' and the 'ON' states is obvious.

According to the comparison as shown in FIG. 14 and FIG. 11, after introducing IGZO interlayer, the memory window of the device becomes significantly larger and the transfer characteristics are significantly improved.

Figure 15:
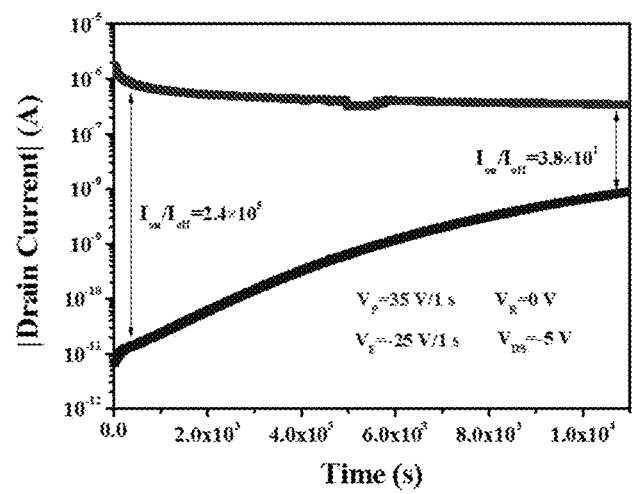
FIG. 15 shows the retention characteristics of pentacene OFETs with IGZO interlayer: The growth parameter of IGZO during the sputtering process was $Ar:O_2=15:1$, the growth time was 1 min, and the thickness was 10 nm, the charge-trapping dielectric is poly (2-vinyl naphthalene) (PVN), the organic semiconductor is pentacene.

FIG. 15 shows the retention characteristics of pentacene OFETs with IGZO interlayer in embodiment 2. The programming pulse is 35V/1 s, and the erasing pulse is −25V/1 s. The applied voltage between the source electrode and the drain electrode is −5V, and the reading voltage is 0 V. The current ratio of $I_{ON}/I_{OFF}$ for the device is still up to $3.8 \times 10^1$ after $1 \times 10^4$ s, indicating that the device has good retention characteristics.

Embodiment 6

The difference between embodiment 3 and embodiment 1 is that the n-type semiconductor layer 3 is IGZO, which thickness is 20 nm, and the preparation method is still magnetron sputtering method, and the growth parameter of IGZO during the sputtering process was $Ar:O_2$=15:1, the growth time was 2 min. The other growth parameters of IGZO are the same as those in embodiment 2, so the carrier concentration is the same as that in embodiment 2, and the increase of the thickness leads to an increase in the quantity of carriers in embodiment 3 as compared with that in embodiment 2.

Figure 16:
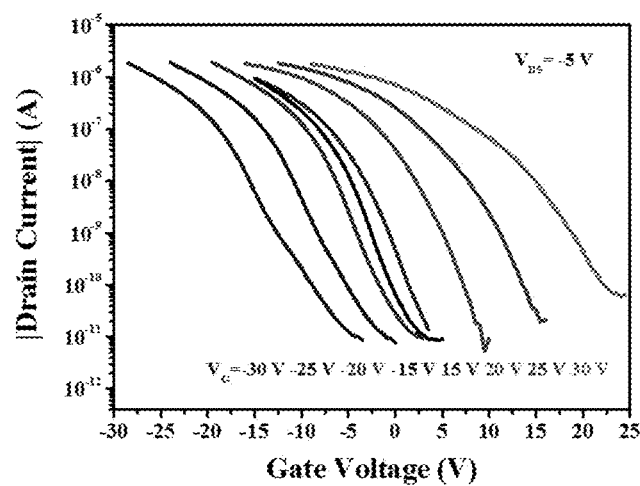
FIG. 16 shows the transfer characteristics of pentacene OFETs with IGZO interlayer: The growth parameter of IGZO during the sputtering process was $Ar:O_2=15:1$, the growth time was 2 min, and the thickness was 20 nm, the charge-trapping dielectric is poly (2-vinyl naphthalene) (PVN), the organic semiconductor is pentacene.

FIG. 16 shows the transfer characteristics of pentacene OFETs with IGZO interlayer in embodiment 3, the voltage between the drain electrode and the source electrode is −5 V, the range of the sweeping voltage applied on the gate electrode is ±15 V~±35 V. It can be seen that the memory window grows rapidly with the increase of the voltage. When the sweeping voltages are ±35 V, the memory window exceeds 40 V, and the difference between the 'OFF' and the 'ON' states is obvious.

According to the comparison as shown in FIG. 16 and FIG. 14, the memory window of the device in embodiment 3 is larger than that in embodiment 2, due to the more n-type carriers in the IGZO interlayer layer. The more negative charges gathering at IGZO/PVN interface, and the larger drops in the height of the barrier at the interface of pentacene/PVN. Thus, the performance of the OFET is more improved.

Figure 17:
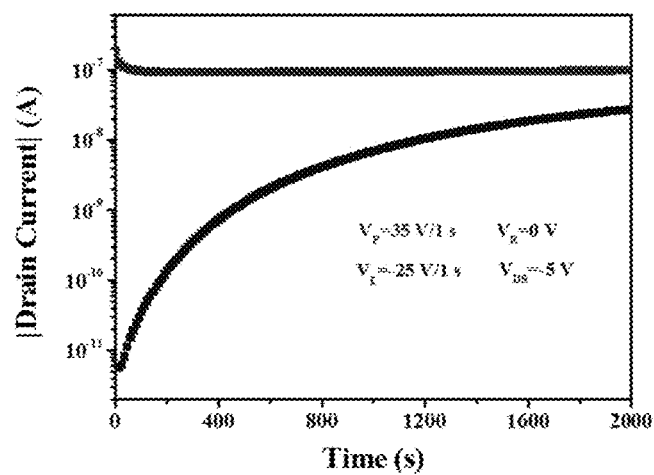
FIG. 17 shows the retention characteristics of pentacene OFETs with IGZO interlayer: The growth parameter of IGZO during the sputtering process was $Ar:O_2=15:1$, the growth time was 2 min, and the thickness was 20 nm, the charge-trapping dielectric is poly (2-vinyl naphthalene) (PVN), the organic semiconductor is pentacene.

FIG. 17 shows the retention characteristics of pentacene OFETs with IGZO interlayer in embodiment 3. The programming pulse is 35V/1 s, and the erasing pulse is −25V/1 s. The applied voltage between the source electrode and the drain electrode is −5V, and the reading voltage is 0 V. The current ratio of $I_{ON}/I_{OFF}$ for the device is less than 10 after 2000 s, indicating that the device has bad retention characteristics.

According to the comparison as shown in FIG. 17 and FIG. 15, the retention characteristics of the device in embodiment 3 is worse than that in embodiment 2 due to the more n-type carriers in the IGZO interlayer layer. The more negative charges gathering at the interface of IGZO/PVN, and the larger drops in the height of the barrier at the interface of pentacene/PVN. Thus, more holes trapped by PVN film may return spontaneously to pentacene.

Based on above knowledge, by keeping the n-type carrier concentration in IGZO layer a constant, the thicker IGZO intercalating layer, the larger quantity of n-type carriers gathering at the interface of IGZO/polymer. Thus, the larger memory window for the OFET is obtained, while the retention characteristics of the device is worse. So, an appropriate thickness of n-semiconductor film should be carefully determined to get a larger memory window and better retention characteristics at the same time.

Embodiment 4

The difference between embodiment 4 and embodiment 1 is that the n-type semiconductor layer 3 is IGZO, which thickness is 10 nm, and the preparation method is still magnetron sputtering method, and the growth parameter of IGZO was $Ar:O_2$=15:0.5, the growth time was 1 min. The other growth parameters of IGZO are the same as those in embodiment 2, so the thickness is the same as that in embodiment 2. Due to the lower partial pressure of oxygen used in embodiment 4, more oxygen vacancies occur in the IGZO film, resulting in a higher carrier concentration, thus leading to an increase in the quantity of n-carriers in embodiment 4 as compared with that in embodiment 2.

Figure 18:
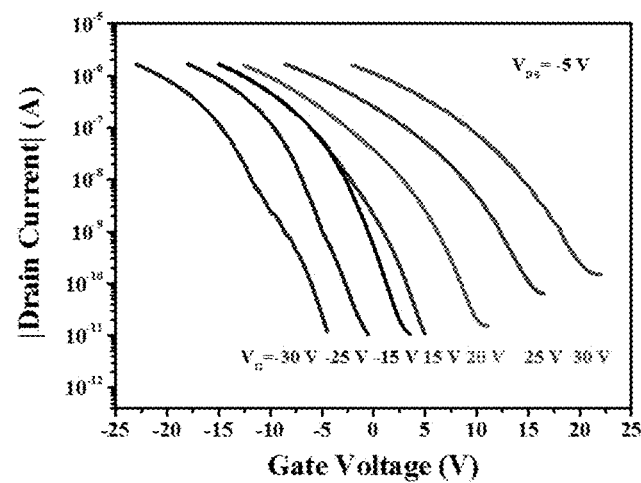
FIG. 18 shows the transfer characteristics of pentacene OFETs with IGZO interlayer: The growth parameter of IGZO during the sputtering process was $Ar:O_2=15:0.5$, the growth time was 1 min, and the thickness was 10 nm, the charge-trapping dielectric is poly (2-vinyl naphthalene) (PVN), the organic semiconductor is pentacene.

FIG. 18 shows the transfer characteristics of pentacene OFETs with IGZO interlayer in embodiment 4, the voltage between the drain electrode and the source electrode is −5 V, the range of the sweeping voltage applied on the gate electrode is ±15 V~±35 V. It can be seen that the memory window grows rapidly with the increase of the voltage.

When the sweeping voltages are ±35 V, the memory window exceeds 35 V, and the difference between the 'OFF' and the 'ON' states is obvious.

According to the comparison as shown in FIG. 18 and FIG. 14, the memory window of the device in embodiment 4 is larger than that in embodiment 2 due to the more n-type carriers in the IGZO interlayer layer. The more negative charges gathering at the interface of IGZO/PVN, and the larger drops in the height of the barrier at the interface of pentacene/PVN. The performance of the OFET is more improved.

Figure 19:
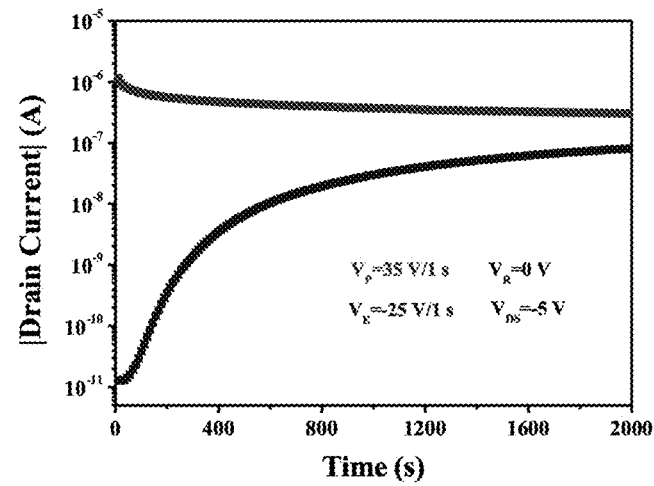
FIG. 19 shows the retention characteristics of pentacene OFETs with IGZO interlayer: The growth parameter of IGZO during the sputtering process was $Ar:O_2=15:0.5$, the growth time was 1 min, and the thickness was 10 nm, the charge-trapping dielectric is poly (2-vinyl naphthalene) (PVN), the organic semiconductor is pentacene.

FIG. 19 shows the retention characteristics of pentacene OFETs with IGZO interlayer in embodiment 4. The programming pulse is 35V/1 s, and the erasing pulse is −25V/1 s. The applied voltage between the source electrode and the drain electrode is −5V, and the reading voltage is 0 V. The current ratio of $I_{ON}/I_{OFF}$ for the OFET is less than 10 after 2000 s, indicating that the device has bad retention characteristics.

According to the comparison as shown in FIG. 19 and FIG. 15, the retention characteristics of the device in embodiment 4 is worse than that in embodiment 2 due to the more n-type carriers in IGZO interlayer layer. The more negative charges gathering at the interface of IGZO/PVN, and the larger drops in the height of the barrier at the interface of pentacene/PVN, thus more holes trapped by PVN likely spontaneously return to pentacene.

Based on above knowledge, by keeping the thickness of IGZO layer a constant, the higher n-type carrier concentration of IGZO layer, the more n-type carriers gathering at the interface. Thus, the larger memory window for the device, while the retention characteristics of the device is worse. So, the appropriate carrier concentration should be carefully determined to get a larger memory window and better retention characteristics at the same time.

It should be understood that the above specific implementation modes of the present invention are only used to exemplify or explain the principles of the invention, and do not constitute a limitation to the invention. Therefore, without deviating from the spirit and scope of the invention, any modification, equivalent replacement, improvement, etc. shall be included in the scope of protection of the invention. In addition, the claims attached to the invention are intended to cover all examples of changes and modifications that fall within the scope and boundaries of the attached claims, or in an equivalent form of such scope and boundaries.

The invention claimed is:

1. A method to prepare a pentacene organic field-effect transistor (OFET) memory, comprising
    providing a p-Si substrate covered with a 90-nm thermally-oxidized $SiO_2$ layer and cleaning the substrate with acetone, ethanol and de-ionized water for 10 minutes successively, and then drying the substrate with a nitrogen gun;
    growing a polymer layer on the p-Si substrate by using a wet-coating method;
    depositing a layer of n-type semiconductor thin film on the PVN-covered $SiO_2$/Si(100) substrate through either a wet-coating method or dry coating method;
    depositing a layer of pentacene through thermal vacuum evaporation; and
    depositing an electrode through thermal vacuum evaporation.

2. The method of claim 1, wherein the polymer is selected from polystyrene, poly(2-vinyl naphthalene) (PVN) and poly(α-methylstyrene) (PαMS).

3. The method of claim 1, wherein the polymer layer is a charge-trapping layer of PVN, having a thickness of 40 nm.

4. The method of claim 1, wherein the wet-coating method includes spin-coating method, sol-gel method, spray method, silk-screen printing method, ink-jet printing method, thermal evaporation method.

5. The method of claim 1, wherein a thickness of the polymer layer is 1-100 nm.

6. The method of claim 1, wherein the n-type semiconductor thin film includes
    n-type organic small-molecule semiconductor and n-type polymer semiconductor, including
    N,N'-Ditridecylperylene-3,4,9,10-tetracarboxylic diimide (PTCDI-C13),
    N,N'-Bis(3-pentyl) perylene-3,4,9,10-bis (dicarboximide) (EP-PDI); and
    1,3,6,8(2H,7H)-Tetraone, 2,7-dicyclohexylbenzo[lmn][3,8]phenanthroline (NDI);
    having a thickness of 1-100 nm;
    in a crystalline thin film, or a semi-crystalline thin film, or an amorphous thin film.

7. The method of claim 1, wherein the n-type semiconductor thin film is an n-type inorganic semiconductor thin film including
    ZnSe, ZnS, ZnO, amorphous indium-gallium-zinc oxide (IGZO),
    an oxygen-deficient oxide film and an oxygen-deficient composite oxide film, including $TiO_{2-x}$ and $ZrHfO_{2-x}$;
    with a thickness is 1-200 nm,
    in a crystalline thin film or a noncrystalline thin film.

8. The method of claim 1, wherein the n-type semiconductor thin film is a hybridized structure with two kinds of n-type semiconductor thin films having a total thickness of 1-100 nm, including
    an n-type inorganic semiconductor film prepared on a surface of a n-type organic small-molecule semiconductor film, or
    an n-type polymer semiconductor film prepared on the surface of a n-type organic small-molecule semiconductor film.

9. The method of claim 7, wherein the dry coat method includes film includes rf-magnetron sputtering, thermal evaporation and electron-beam evaporation.

10. The method of claim 8, wherein the thickness of n-type organic semiconductor film in the hybridized structure is 0.5-60 nm, the thickness of n-type organic semiconductor film is 0.5-60 nm, but the thickness of hybridized film is 1-100 nm.

11. The method of claim 1, wherein the electrode has a side-length of 300 μm and a thickness of 100 nm.

* * * * *